United States Patent [19]
Hsiao et al.

[11] 3,984,780
[45] Oct. 5, 1976

[54] CMOS VOLTAGE CONTROLLED CURRENT SOURCE

[75] Inventors: Perng Hsiao; Fuad H. Musa, both of Tempe, Ariz.

[73] Assignee: Motorola, Inc., Chicago, Ill.

[22] Filed: Sept. 11, 1974

[21] Appl. No.: 505,104

[52] U.S. Cl. .................................. 330/35; 330/28; 330/30 D
[51] Int. Cl.² .......................................... H03F 3/16
[58] Field of Search .................... 330/28, 30 D, 35; 307/304, 297

[56] References Cited
UNITED STATES PATENTS

| | | | |
|---|---|---|---|
| 3,696,305 | 10/1972 | Mitchell et al. ..................... | 330/35 X |
| 3,715,693 | 2/1973 | Fletcher ........................... | 330/35 X |

FOREIGN PATENTS OR APPLICATIONS

| | | | |
|---|---|---|---|
| 1,239,213 | 7/1971 | United Kingdom ............... | 330/30 D |

OTHER PUBLICATIONS
Watson, "Testing Gate–Leakage Current in FETS" *Electronic Engineering*, June 1972, pp. 53–55.
*Integrated Circuits*, RCA Institutes copyright 1969 p. 3.24.
Thompson, "A Very High Input Impedance Buffer Using Field Offset Transistors," *Electronic Engineering*, June 1966, pp. 370–373.
Towers, "Balanced Transistor D.C. Amplifiers," *Wireless World*, Aug. 1968, pp. 269–274.

*Primary Examiner*—James B. Mullins
*Attorney, Agent, or Firm*—Harry M. Weiss; Charles R. Hoffman

[57] ABSTRACT

A CMOS voltage controlled current source is described for furnishing current to a load in a charging mode and to receive current from a load in a discharging mode of operation. This bi-lateral current source is voltage controlled and provides a current which is proportional to the applied voltage. The current flow into, and out of the current source changes in a linear fashion and varies proportional to the input control voltage. This bi-lateral current source is made from all CMOS devices.

10 Claims, 8 Drawing Figures

CMOS VOLTAGE CONTROLLED CURRENT SOURCE

BACKGROUND OF THE INVENTION

In the prior art, many types of current sources are available. These are bipolar circuits and even some MOS circuits. However, each of these circuits suffer a number of drawbacks which limit their operation. Such circuits suffer from a non-linear mode of operation. A non-linear mode of operation is that the current originating from the current source does not change in a manner which is proportional to the voltage applied to the source. Accordingly, such a circuit would have a limited use. Another problem facing these prior art circuits is that they are highly sensitive to small changes in the voltage level of the supply voltage. This means that the supply voltage utilized in the circuit must be highly regulated in order to provide a constant voltage level. In the event that the supply voltage is not highly regulated and kept at a predetermined level, the current output from the current source is not proportional to the applied voltage and will vary over a wide range. Another problem facing the prior art current sources is that such current sources are very sensitive to device threshold voltages. This means that the threshold voltage varies from device to device resulting in inaccurate current flowing from the current source. Another problem relating to the prior art MOS current sources is a sensitivity to the MOS device geometry. The output from such current sources vary according to slight changes in device geometry that occur between MOS devices. Another problem facing the prior art current sources is that they are sensitive to temperature variation. The temperature of the current source chip must be controlled in order to achieve a predictable current output from the current source. Whenever the temperature of a chip is raised through added current consumption, the current output from the current source can also change, thus injecting some error into the circuit operation.

SUMMARY OF THE INVENTION

The present invention relates to CMOS circuits, and more particularly, it relates to a CMOS voltage controlled current source which utilizes complementary metal-oxide-silicon-field-effect transistors. These CMOS devices are of the enhancement type and may use either a metal gate or silicon gate.

It is an object of the present invention to provide a voltage controlled current source in which the current is linearly proportional to the input controlling voltage.

A further object of the present invention is to provide a voltage controlled current source in which the current is independent of the CMOS device parameters.

A still further object of the present invention is to provide a voltage controlled current source in which all the components are amenable to CMOS monolithic integration.

Another object of the present invention is to provide a voltage controlled current source having an extremely high input impedance.

A still further object of the present invention is to provide a voltage controlled current source which is capable of operating over a wide range of DC supply voltages at low DC current drains.

Another object of the present invention is to provide a voltage controlled current source which is capable of producing both a current source and a current sink.

A still further object of the present invention is to provide a bilaterally operable current source which can provide current to a load in a charging mode and to receive current from a load in a discharging mode of operation.

These and other objects and features of this invention will become fully apparent in the following description of the accompanying drawings.

BRIEF DESCRIPTION OF THE INVENTION

The present invention is directed to a CMOS voltage controlled current source capable of bilateral modes of operation. In a first mode of operation the CMOS current source supplies current to a load. In a second mode of operation the CMOS voltage controlled current source accepts current from a load. In both modes of operation the magnitude of the current is controlled by the voltage applied to the current source itself. For the same supply voltage control signal, the charging current and the discharging current is of equal magnitude.

The circuit is capable of operation over a wide range of input control voltages and yet remains independent of the supply voltage, the threshold voltage, the MOS device geometry, and temperature. In this mode of operation, the voltage controlled current source handles a charging current which is linearly proportional to the control signal.

The CMOS voltage controlled current sources described hereinafter operate over a wide range of supply voltages and operate from either a single negative supply voltage or a single positive supply voltage or a combination of both. The supply voltage selected influences the voltage level around which the output signal fluctuates.

The voltage controlled CMOS current source comprises several basic building blocks in each of its configurations. A first building block is a bias circuit for providing the current required by the remaining building blocks. The bias circuit has a means for correcting any offset voltage required in the circuit. A high gain differential amplifier stage comprises a pair of input transistors with their active loads and a high gain stage for amplifying the output of the differential amplifier stage. The output from the high gain stage is applied to a drive transistor having a reference resistor connected in series with the current flowing in the source-drain circuit of the drive transistor. The drive transistor supplies current to or accepts current from the load. A feedback signal is taken from the junction of the drive transistor and the reference resistor and fed back as one input to the differential amplifier. The control voltage is applied to the second input transistor of the differential amplifier.

DETAILED DESCRIPTION OF THE INVENTION

In the several views, the same numeral will be used to identify the same element.

Figure 1:
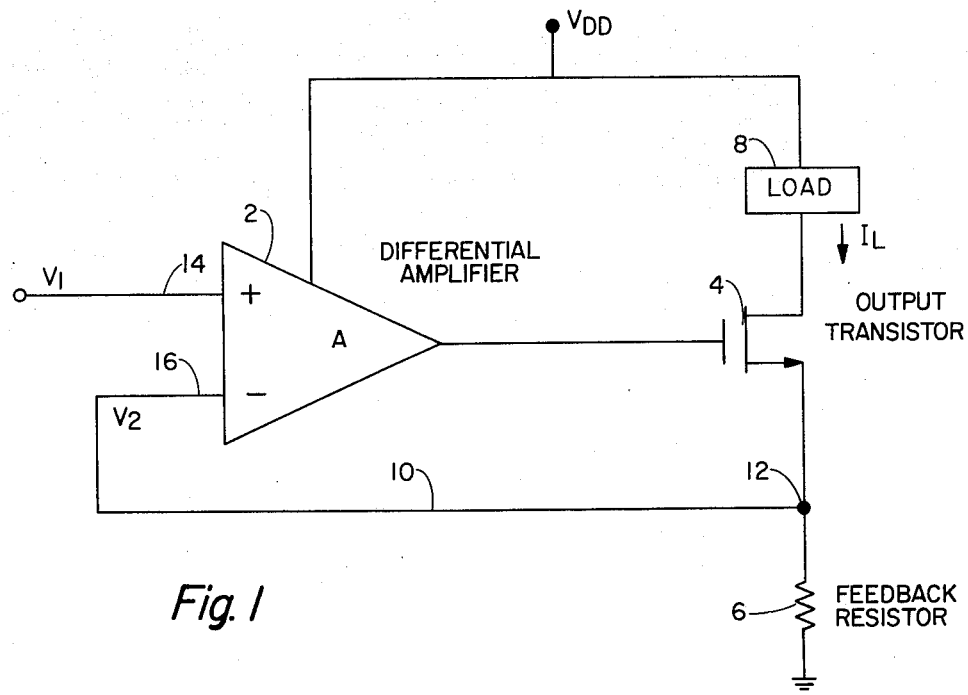
FIG. 1 is a block diagram of a voltage controlled current source.

Referring to FIG. 1, there can be seen the block diagram of the CMOS voltage controlled current source. This voltage controlled current source consists of a high gain differential amplifier 2 connected in series with a source follower consisting of transistor 4 and resistor 6. The source follower comprises an output driving stage for providing current to a load 8 or for accepting current from the load 8. A negative feedback loop identified as 10 connects the junction 12 of the resistor 6 and the source electrode of the transistor 4 to the non-inverting input side of the differential amplifier 2. Under ideal conditions, i.e., zero input offset voltage, zero input bias current and zero input leakage current, the control voltage $V_2$ input line 16, will be virtually equal to $V_1$ on input line 14, a finite difference between $V_1$ and $V_2$ will exist even under ideal conditions due to the finite gain of the amplifier. A MOSFET can be thought of as a transistor with an infinite beta. This is due to the infinite input impedance between the gate and source terminals of the device. Hence, since no current flows into the inverting input terminal of the differential amplifier, it becomes obvious that the current in the load ($l_L$) is equal to $V_1$ divided by the resistor 6 ($l_1 = lR_1$).

Therefore, the current through the load is controlled by the input voltage at the control terminal 14. This voltage is also referred to as $V_1$. The current through the load varies linearly and directly by the input voltage ($V_1$) at terminal 14.

If the reference feedback voltage at terminal 16 is smaller than the input control voltage at terminal 14, then this voltage difference will be amplified by the high gain differential amplifier 2. This amplified error voltage will force the gate voltage of transistor 4 to increase. This increases the drain-to-source current in transistor 4 which causes the voltage at node 12 to increase and approach the input voltage $V_1$. At equilibrium $V_1$ and $V_2$ will be virtually equal except for some error due to finite amplifier voltage gain and input offset voltage. Therefore, the current in resistor 6 and hence, $l_L$ will be equal to $V_1$ divided by resistor 6. Therefore, $l_L$ is linearly proportional to $V_1$.

In the event that the feedback voltage at terminal 16 is larger than the input control voltage at terminal 14, then the output from the differential amplifier would decrease and the signal applied to the gate of the transistor 4 would decrease, thereby reducing the amount of current flowing through transistor 4 and also through the load 8 and the feedback resistor 6. This reduced current creates a reduced voltage feedback potential at the junction 12 which is fed back to terminal 14 until the voltage at terminals 14 and 16 are virtually the same and $l_L$ again becomes equal to $V_1$ divided by the resistor 6.

In this event, the circuit shown in FIG. 1 is capable of generating a current flowing in the load 8 which is proportional to the voltage applied to the terminal 14. When the voltage at terminal 14 changes, then the system seeks out the new current level to flow through the load by seeking to generate a voltage at the junction 12 which is equal to the voltage available at the input terminal 14 of the differential amplifier. The negative feedback is required for correcting the difference between the voltages applied to the two terminals of the differential amplifier. The output driving transistor is a means for generating the current for flowing into and out of the load 8. The feedback resistor is connected in series with the output driving transistor and is employed for generating a comparison voltage which is fed back and compared within the differential amplifier with the input terminal voltage. FIGS. 2 through 5b show various circuits which operate under different conditions.

Figure 2:
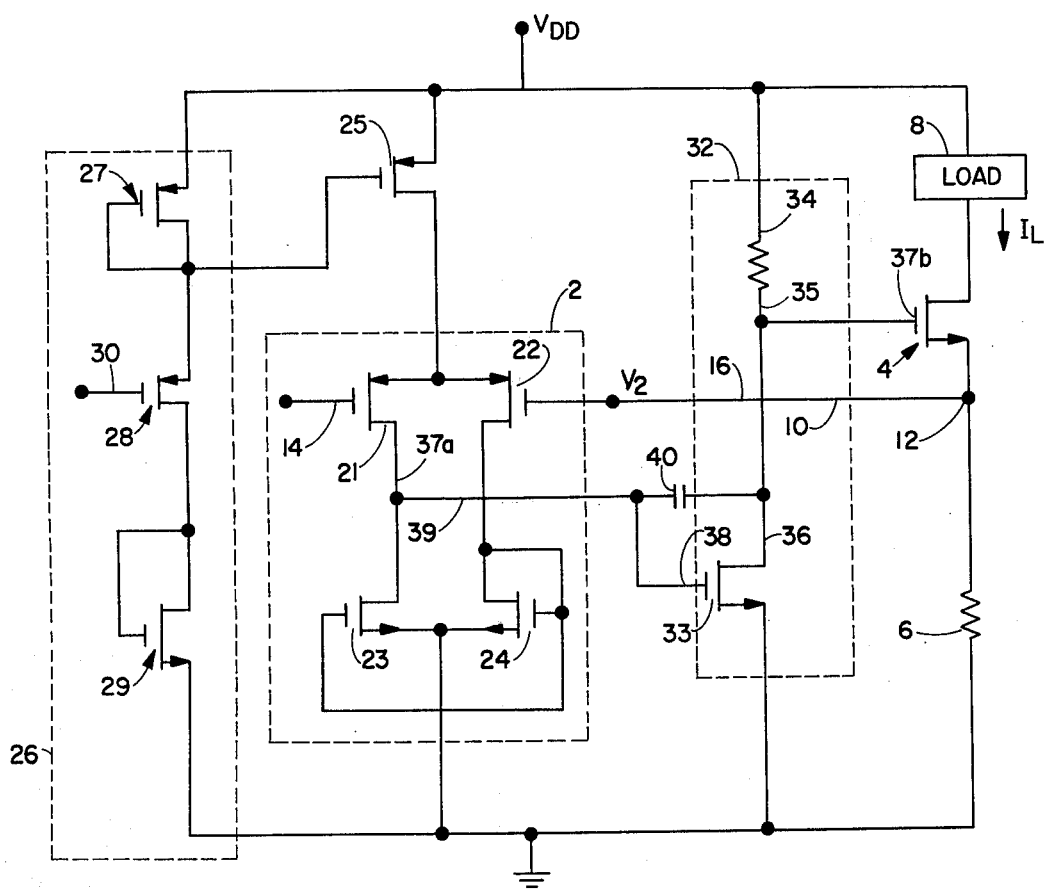
FIG. 2 is a circuit schematic of a voltage controlled current source.
Figure 3A:
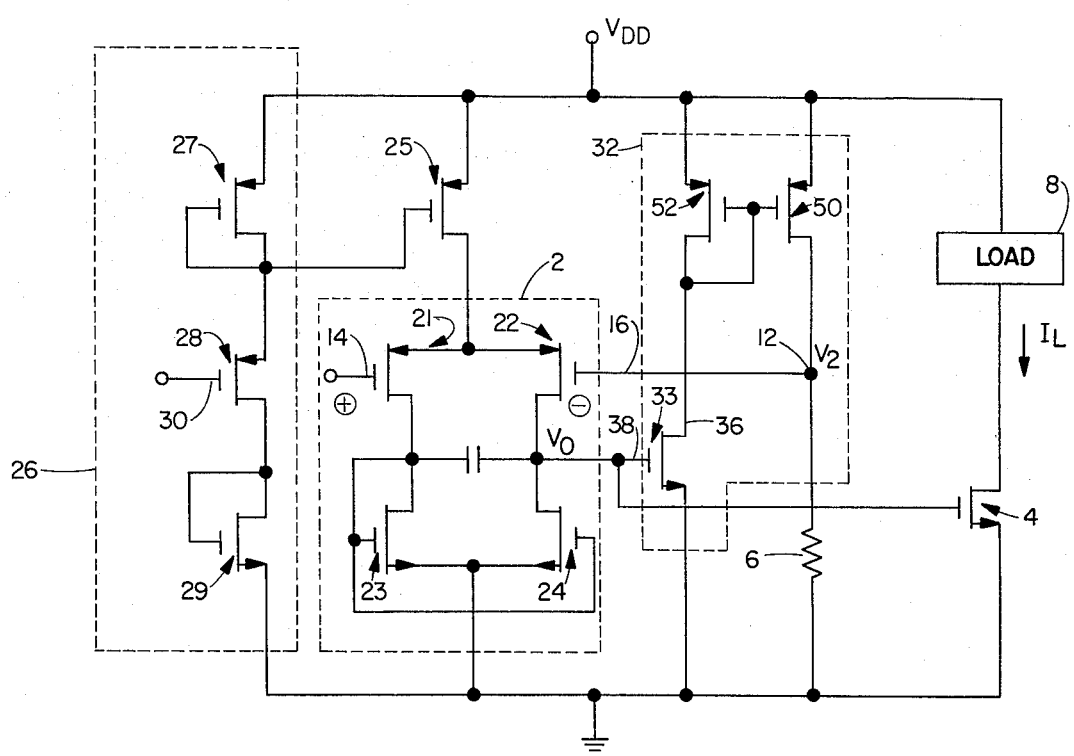
FIG. 3a is a circuit diagram of a voltage controlled current sink with a single positive DC power supply.

Referring to FIG. 2 there is seen a schematic diagram of a first embodiment of the constant current source. The differential amplifier 2 comprises a pair of input transistors 21 and 22. Active loads are provided for transistors 21 and 22 by MOS devices 23 and 24, respectively. The current for driving the differential amplifier is provided by a constant current source transistor 25. The bias current for the constant current source is provided by a biased network 26. The bias network 26 as shown in FIG. 2, is a typical design. Additional bias networks which are useable in this embodiment as well as the other embodiments shown in FIGS. 3a and 5b, are described in a copending patent application entitled "Differential Amplifier" filed Sept. 11, 1974, Ser. No. 505,101. This biased network comprises a plurality of transistors 27, 28 and 29. This bias network has an input voltage at a terminal 30 which can be used to control the DC current drain and also to adjust for offset voltages of the entire circuit.

The drive transistor is at 4 with the reference resistor positioned in series connection at 6. The load is at 8. The feedback voltage at 12 is applied to the second voltage terminal $V_2$ by the line 10. A high gain stage 32 comprises a transistor 33 and a resistor 34 arranged in a series connection. The junction 35 between the resistor 34 and the drain electrode 36 of the transistor 33 is connected as the input to the gate electrode 37b of the drive transistor 4. The drain electrode 37a of the transistor 21 is connected to the gate electrode 38 of the transistor 33 by a line 39. The output of the differential amplifier is taken from the drain electrode 37a and is applied to the gate electrode 38 of the transistor 33. A capacitor 40 is connected between the drain terminal 36 of the transistor 33 and the gate electrode 38 of the transistor 33 to provide stable overall amplifier operation.

The current $l_L$ flowing through the load 8 yields a voltage drop across the resistor 6 which is equal to the voltage $V_1$ at terminal 14 decided by the value of the resistor 6.

In operation, when the voltage at terminal 14 ($V_1$) is less than the voltage at terminal 16 ($V_2$), the voltage applied to the gate electrode 38 of the transistor 33 is increased and the voltage at junction 35 comes close to the value of ground. Hence, the voltage applied to the gate electrode 37b of the transistor 4 is reduced causing a lower current flow $l_L$ through the load. In this manner, the voltage at junction 12 falls and provides a lower voltage at terminal 16 ($V_2$). In this manner, the voltage at terminal 16 changes until it is essentially equal to the voltage at $V_1$.

In FIG. 3 there is shown a modified version of voltage controlled current source. As shown in FIG. 2, one requirement for a good current source is to provide a wide voltage variation across the output of the current source. This circuit is applied by a single positive power supply $V_{DD}$. The non-inverting input to the differential amplifier is at terminal 14. The inverting input to the differential amplifier is at the terminal 16. The negative feedback is available at junction 12.

The circuit shown in FIG. 3a provides two improvements over the circuit shown in FIG. 2. One improvement is a higher voltage string across the current source. The second improvement provides a higher linear region over which the output current varies linearly with the input voltage. These two are important requirements in any good voltage current source. The circuit shown in FIG. 3a comprises a differential amplifier 2, and output drive transistor 4, a bias network 26, and an intermediate stage 32. The operation of the differential amplifier was previously described, and need not be repeated here.

In operation, sufficient gain exists between the differential amplifier and the intermediate gain stage to cause the internally generated voltage $V_2$ at terminal 16 to become equal to the applied voltage $V_1$ at terminal 14. The voltage $V_2$ generates a current through resistor 6 being equal to $I_{R1}$. $I_{R1}$ is the same current that flows between the drain and source terminals of a transistor 50. Transistors 50 and 52 are made the same and form a current mirror. Since transistor 52 is in series with transistor 33 and there is no other path for current to flow, transistor 33 conducts the same amount of current flowing in transistors 50 and 52. Therefore, the current through transistor 33 is also equal to $I_{R1}$. Transistor 4 is also the current mirror of transistor 33 and therefore, transistor 4 conducts the same current as transistors 33, 50 and 52, which is equal to $I_{R1}$. Due to the infinite beta characteristics of the transistor 4, the same current flows in both the source and drain electrodes of transistor 4. This makes $I_L$ equal to $I_{R1}$. Since voltage $V_2$ is approximately equal to the voltage $V_1$, and since $I_{R1}$ is equal to $V_2/R_1$, then $I_L$ is approximately equal to $V_1/R_1$ and, hence, the voltage controlled nature of that load current source.

In a different embodiment, resistors, not shown, can be inserted between the source terminals of transistors 50 and 52 and $V_{DD}$. These resistors act as linearizing elements which tends to lessen the importance of the $V_{gs}$ match or the threshold voltage match of the two transistors 50 and 52. Similarly, two resistors can be inserted in the sources of transistors 4 and 33 to insure that these two devices will conduct equal current even though their threshold voltages may vary slightly.

A current source can be either a source of current to a load and, hence, be a positive current source, or a current source can be a sink of current from a load and, hence, be a negative current source.

Figure 4A:
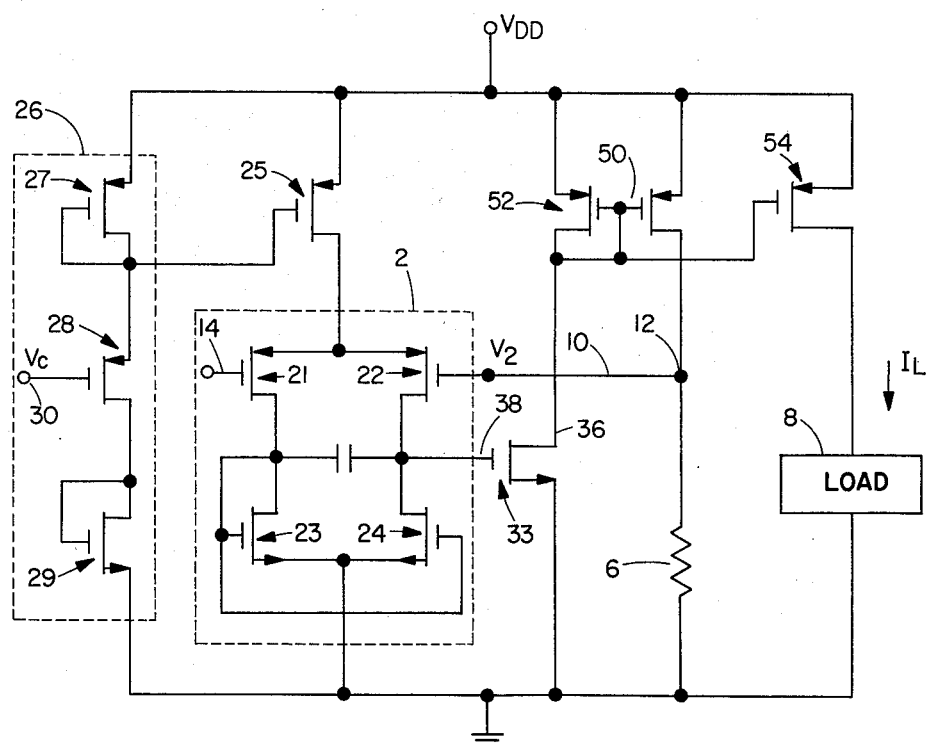
FIG. 4a is a circuit diagram of a voltage controlled current source with a single positive DC power supply.

The circuit shown in FIG. 4a is similar to the circuit shown in FIG. 3a. The difference is that in FIG. 3a the voltage to control the current $I_L$ is drawn away from the load and in FIG. 4a we connect a further transistor 54 as a current mirror to the transistors 50 and 52. Therefore, the load is connected to the drain electrode 56 of transistor 54. The voltage to control the current $I_L$ is supplied to the load by transistor 54. The circuit shown in FIG. 3a is a negative current source and the circuit shown in FIG. 4a is a positive current source.

Figure 3B:
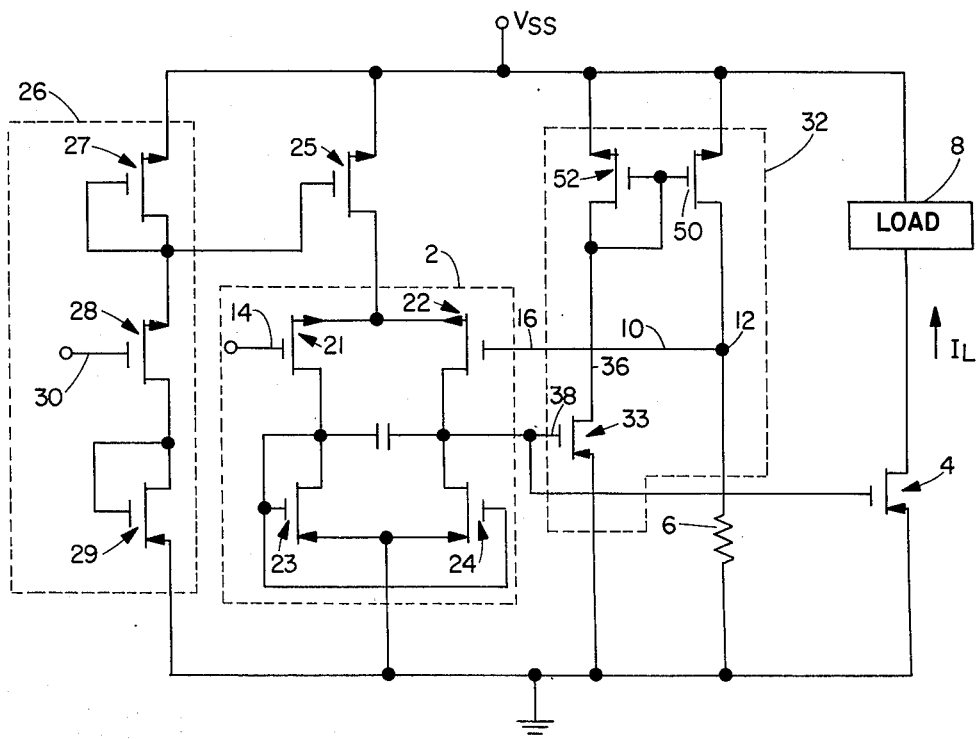
FIG. 3b is a circuit diagram of a voltage controlled current source with a single negative DC power supply.

The circuit shown in FIG. 3b is essentially the same circuit as shown in FIG. 3a except that all P-channel devices have been replaced by N-channel devices and all N-channel devices have been replaced by P-channel devices. The positive voltage $V_{DD}$ of FIG. 3a has been replaced by a negative voltage $V_{SS}$.

Figure 4B:
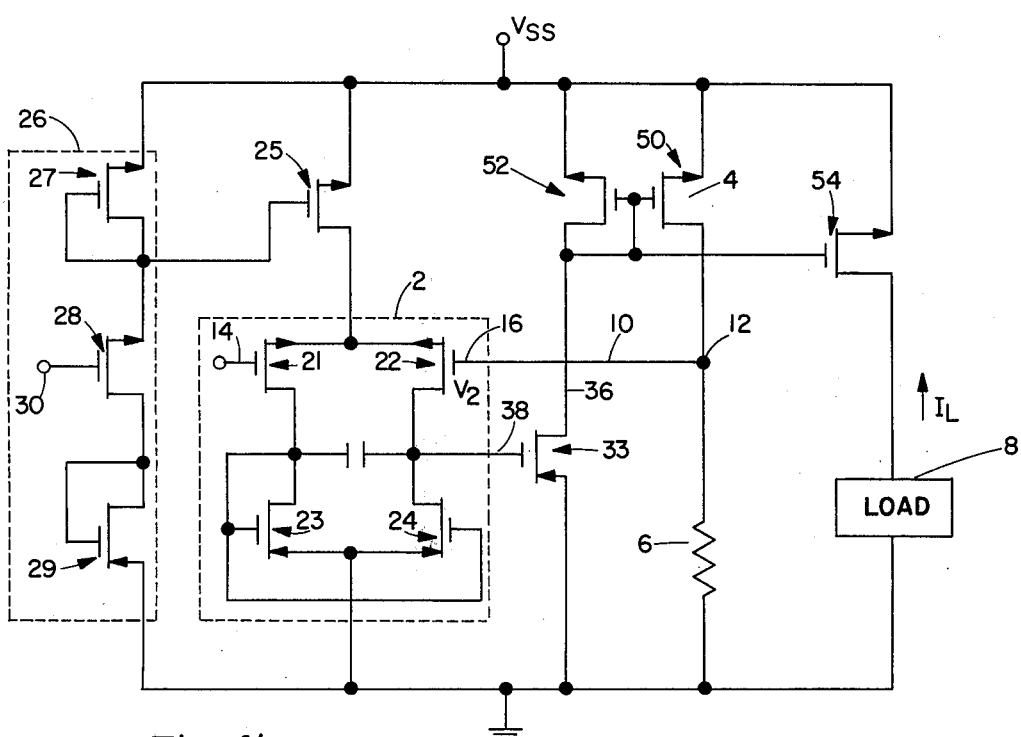
FIG. 4b is a circuit diagram of a voltage controlled current sink with a single negative DC power supply.

Essentially, the only difference is that in FIG. 3a, transistor 4 pulled current out of the load 8 to form a negative current source, while in FIG. 3b, transistor 4 drives current into the load. Similarly, FIG. 4b is a view of FIG. 4a in which all the P-channel devices in FIG. 4a are replaced by N-channel devices in FIG. 4b and all the N-channel devices in FIG. 4a are replaced by P-channel devices in FIG. 4b. A negative power supply $V_{SS}$ is provided and the current source now operates as a negative current source.

Figure 5A:
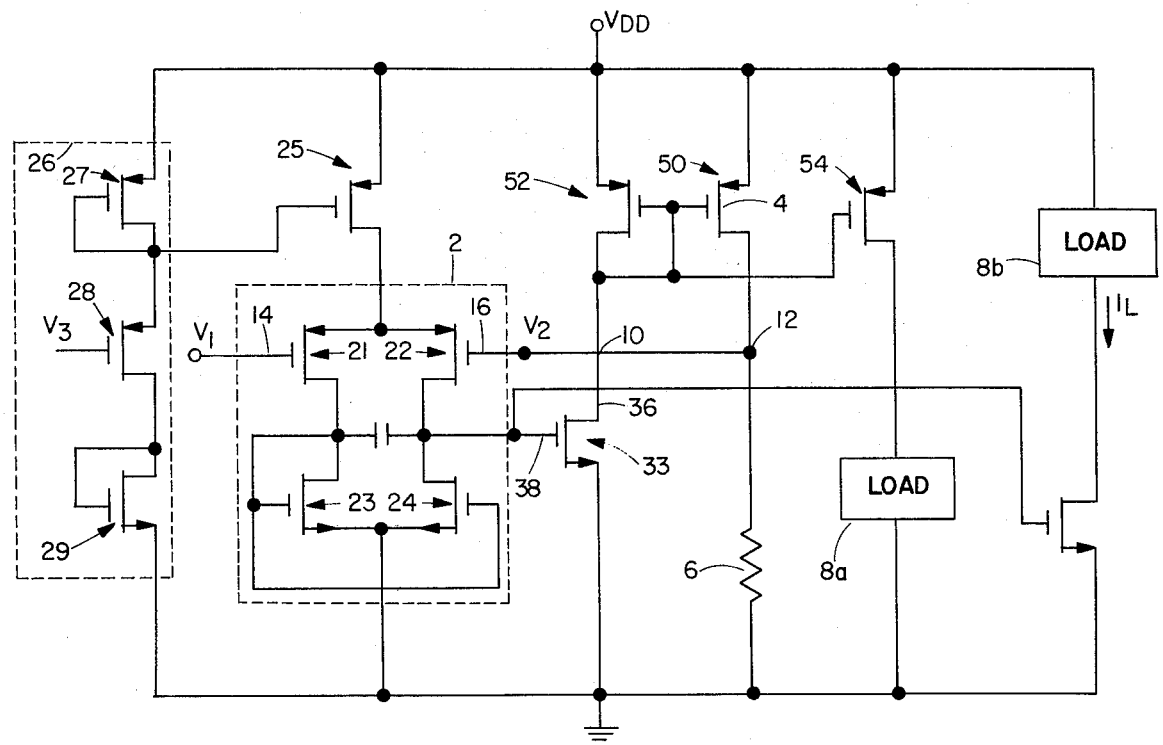
FIG. 5a is a circuit diagram of a composite voltage controlled current source operating with a single positive DC power supply.
Figure 5B:
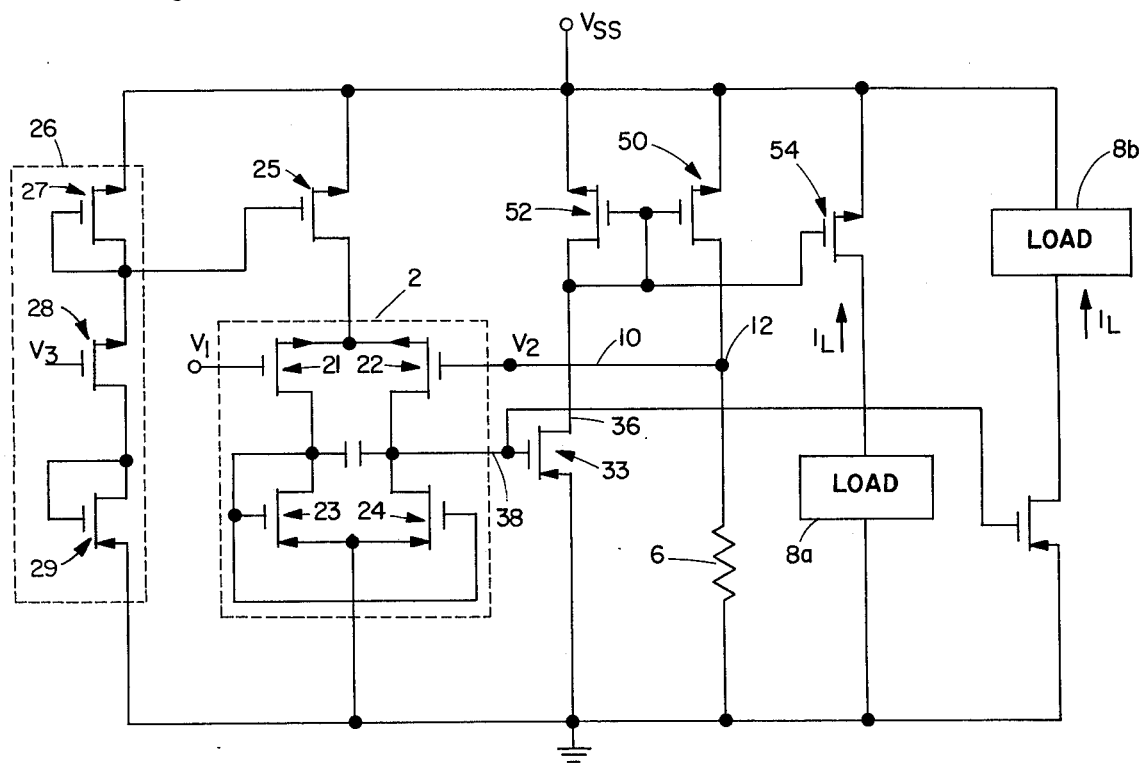
FIG. 5b is a circuit diagram of a composite voltage controlled current source.

The circuit shown in FIG. 5a is a combination of the circuits shown in FIGS. 3a and 4a. The circuit shown in FIG. 5a drives current into load 8a and pulls the same amount of current out of load 8b. It also operates from a positive voltage supply $V_{DD}$.

The circuit shown in FIG. 5b is a combination of the circuits shown in FIGS. 3b and 4b. The circuit shown in 5b drives current into load 8b and pulls the same amount of current out of load 8a. It also operates from a negative voltage supply $V_{SS}$.

While there has been shown and described and pointed out the fundamental novel features of the invention as applied to the preferred and other embodiments, it will be understood that various omissions and substitutions and changes in the form and details of the structural element may be made by those skilled in the art without departing from the spirit of the invention.

What is claimed is:

1. A voltage controlled current source for generating an output current which is linearly proportional to an input voltage comprising:
   a. differential amplifier means having a first input coupled to said input voltage and having a second input, for generating an output signal indicative of the difference in voltage between said first input and said second input;
   b. high gain stage means responsive to the output of said differential amplifier means for amplifying said output signal and for generating a reference voltage;
   c. output means responsive to said output signal for generating said output current which is linearly proportional to said reference voltage; and
   d. feedback means coupling said reference voltage to said second input for causing said reference voltage to equal said input voltage wherein said high gain stage comprises:
   e. a first MOSFET device of a first conductivity type having a source coupled to a first power supply conductor, a gate coupled to said output signal and a drain;
   f. a second MOSFET device of a second conductivity type opposite to the first conductivity type having a source connected to a second power supply conductor, a gate coupled to the drain of said first MOSFET device and a drain coupled to the drain of said first MOSFET device;
   g. a third MOSFET device of the second conductivity type having a source coupled to the second power supply conductor, a gate coupled to the gate of the second MOSFET and a drain;

h. impedance means coupled between the drain of the third MOSFET and the first power supply conductor for generating said reference voltage.

2. A voltage controlled current source as recited in claim 1 wherein said output means comprises an output MOSFET having a source coupled to said first power supply conductor, a gate coupled to said output of said differential amplifier means and a drain, said drain providing an output current to a load.

3. A voltage controlled current source as recited in claim 2 wherein said MOSFET of said first conductivity type is a P-channel MOSFET.

4. A voltage controlled current source as recited in claim 2 wherein said MOSFET of said first conductivity type is a N-channel MOSFET.

5. A voltage controlled current source as recited in claim 1 wherein said output means comprises an output MOSFET having a source connected to said second power supply conductor, a gate connected to the output of said differential amplifier means, and a drain, said drain providing an output current to a load.

6. A voltage controlled current source as recited in claim 5 wherein said MOSFET of said first conductivity type is a P-channel MOSFET.

7. A voltage controlled current source as recited in claim 5 wherein said MOSFET of said first conductivity type is a N-channel MOSFET.

8. A voltage controlled current source as recited in claim 1 wherein said output means comprises:
   a. a first output MOSFET having a source connected to said first power supply conductor, a gate connected to the output of said differential amplifier and a drain, said drain producing an output current in a first load;
   b. a second output MOSFET having a source connected to said second power supply conductor a gate coupled to said high gain stage means and a drain, said drain producing a second output current in a second load.

9. A voltage controlled current source as recited in claim 8 wherein said MOSFET of said first conductivity type is a P-channel MOSFET.

10. A voltage controlled current source as recited in claim 8 wherein said MOSFET of said first conductivity type is a N-channel MOSFET.

* * * * *